(12) United States Patent
Conte et al.

(10) Patent No.: US 9,972,394 B2
(45) Date of Patent: May 15, 2018

(54) LEVEL SHIFTER CIRCUIT AND ASSOCIATED MEMORY DEVICE

(71) Applicant: STMicroelectronics S.r.l., Agrate Brianza (IT)

(72) Inventors: Antonino Conte, Tremestieri Etneo (IT); Carmelo Paolino, Palermo (IT); Maurizio Francesco Perroni, Furnari (IT); Salvatore Polizzi, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days. days.

(21) Appl. No.: 15/476,003

(22) Filed: Mar. 31, 2017

(65) Prior Publication Data

US 2018/0061495 A1    Mar. 1, 2018

(30) Foreign Application Priority Data

Aug. 30, 2016  (IT) .............................. UA2016A6285

(51) Int. Cl.

| G11C 16/12 | (2006.01) |
|---|---|
| H03K 19/0185 | (2006.01) |
| G11C 16/20 | (2006.01) |
| G11C 16/08 | (2006.01) |
| G11C 13/00 | (2006.01) |
| G11C 16/26 | (2006.01) |

(52) U.S. Cl.
CPC .......... *G11C 16/12* (2013.01); *G11C 13/0004* (2013.01); *G11C 16/08* (2013.01); *G11C 16/20* (2013.01); *G11C 16/26* (2013.01); *H03K 19/018521* (2013.01)

(58) Field of Classification Search
CPC ..... G11C 16/12; G11C 16/26; G11C 13/0004; G11C 16/20; G11C 16/08; H03K 19/018521; H03K 3/356182; H03K 3/35613
USPC ...... 365/185.23, 189.11, 189.09; 326/62–63, 326/68
See application file for complete search history.

(56) References Cited

U.S. PATENT DOCUMENTS

| 5,734,914 | A | 3/1998 | Nakamura et al. |
|---|---|---|---|
| 6,094,083 | A | 7/2000 | Noda |
| 6,249,145 | B1 | 6/2001 | Tanaka et al. |
| 6,351,173 | B1 | 2/2002 | Ovens et al. |
| 6,580,411 | B1 | 6/2003 | Kubota et al. |
| 7,239,191 | B2 | 7/2007 | Lee |
| 8,451,681 | B2 * | 5/2013 | Maejima ................. G11C 8/08 365/148 |
| 9,197,200 | B2 * | 11/2015 | Teplechuk ......... H03K 3/35613 |
| 9,461,648 | B1 * | 10/2016 | Lee .................. H03K 19/00315 |

(Continued)

*Primary Examiner* — David Lam
(74) *Attorney, Agent, or Firm* — Slater Matsil, LLP (57) ABSTRACT

A level shifter circuit is designed to shift an input signal that switches within a first voltage range to supply an output signal that switches within a second voltage range, higher than the first voltage range. A first inverter stage has an input receiving the input signal and also has an output. A first capacitive element is connected between the output of the first input inverter stage and a first holding node. A latch stage is connected between the first holding node and a second holding node that is coupled to an output terminal, on which the output signal is present. The first input inverter stage is designed to operate in the first voltage range, and the latch stage is designed to operate in the second voltage range.

23 Claims, 4 Drawing Sheets

(56) References Cited

U.S. PATENT DOCUMENTS

| | | | |
|---|---|---|---|
| 9,576,968 B2* | 2/2017 | Hishida | G11C 5/025 |
| 2009/0302924 A1 | 12/2009 | Kim | |
| 2011/0063012 A1 | 3/2011 | Chan et al. | |
| 2013/0222036 A1 | 8/2013 | Kwon | |
| 2015/0333556 A1* | 11/2015 | Goyal | H02J 7/0042 |
| | | | 320/166 |

* cited by examiner

LEVEL SHIFTER CIRCUIT AND ASSOCIATED MEMORY DEVICE

CROSS-REFERENCE TO RELATED APPLICATIONS

This application claims priority to Italian Patent Application No. 102016000088225, filed on Aug. 30, 2016, which application is hereby incorporated herein by reference.

TECHNICAL FIELD

The present invention relates to a level shifter circuit.

BACKGROUND

As it is known, level shifter circuits (or level shifters) have several applications, for example, wherever it is required to interface two circuit stages operating at different voltage levels. In particular, level shifter circuits are used in non-volatile memory devices, for example, of a flash or PCM (Phase-Change Memory) type, of an embedded type (the so-called eNVMs—embedded Non-Volatile Memories). In these memory devices an internal supply voltage is present (the so-called logic supply voltage Vdd, with low voltage values, for example, comprised between 1 V and 1.35 V). Moreover, in order to be able to modify (during programming or erasing) and read the contents of the memory cells, use of higher operating voltages, with high voltage values, for example, higher than or equal to 3.6 V, is required.

Due to the different range of values of the voltages present in these memory devices, use of level shifter circuits is thus required, in order to interface and put in communication low-voltage and high-voltage circuit stages.

Level shifter circuits of a known type are generally made with high-voltage (HV) transistors, i.e., ones that are able to operate with high voltage values without undergoing failure (for example, of the corresponding junction oxides), or else, in some cases, with mixed solutions of high-voltage transistors and low-voltage (LV) transistors, i.e., ones that are able to operate without danger of undergoing failure only for voltage values not higher than a given threshold voltage, typically in the region of the logic supply voltage Vdd.

In a known way, HV transistors have structural characteristics, as compared to LV transistors, for example, as regards a greater thickness of the gate oxide, that make it possible to withstand without undergoing failure higher voltage values between their corresponding control and current-conduction terminals.

Figure 1:
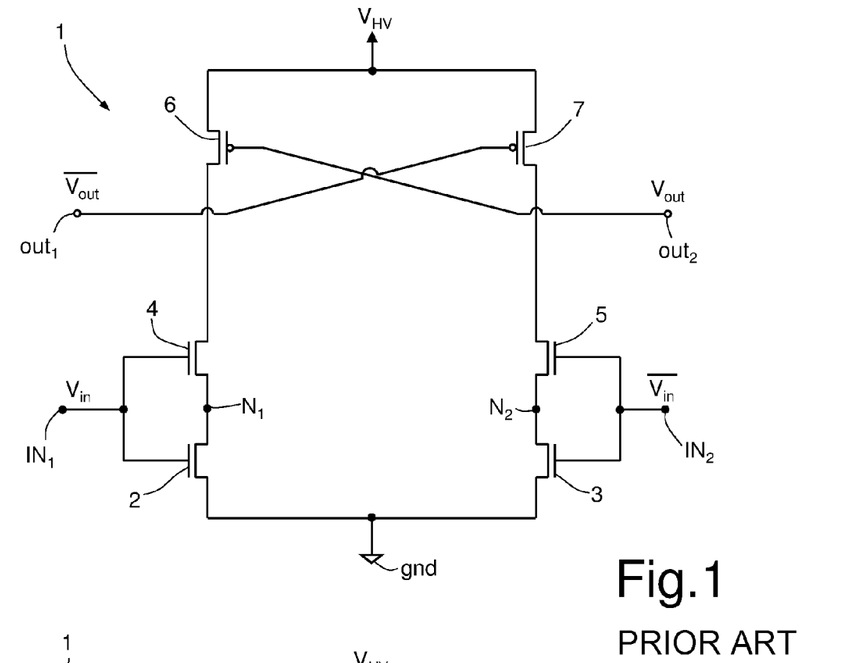
FIG. 1 shows a level shifter circuit of a known type.

FIG. 1 shows a level shifter circuit of a known type, designated by 1, designed to shift an input signal $V_{in}$ operating in the low-voltage range [0, Vdd] into an output signal $V_{out}$ operating in the high-voltage range [0, $V_{HV}$], where $V_{HV}$ is a high, or level-shifted, voltage, in what follows referred to as "high voltage", of an appropriate value, greater than the logic supply voltage Vdd.

The level shifter circuit 1 comprises: a first input transistor 2, of an LV NMOS type (for example, having a first thickness of the gate oxide such as to undergo failure for high voltage values), connected between a first reference terminal (set at ground, gnd) and a first transfer node $N_1$, and having the gate terminal connected to a first input terminal $IN_1$, which receives the input signal $V_{in}$; and a second input transistor 3, which is also of an LV NMOS type, connected between the first reference terminal set at ground and a second transfer node $N_2$, and having the gate terminal connected to a second input terminal $IN_2$, which receives the negated, or complementary, version of the input signal, designated by $\overline{V_{in}}$.

The level shifter circuit 1 further comprises: a first protection transistor 4, of an HV NMOS type (for example, having a second thickness of the gate oxide, greater than the aforesaid first thickness, such as not to cause failure for high voltage values), connected between the first transfer node $N_1$ and a first output terminal $OUT_1$, and having the gate terminal connected to the first input terminal $IN_1$; and a second protection transistor 5, which is also of an HV NMOS type, connected between the second transfer node $N_2$ and a second output terminal $OUT_2$, and having the gate terminal connected to the second input terminal $IN_2$.

The level shifter circuit 1 further comprises: a first output transistor 6, of an HV PMOS type, connected between the first output terminal $Out_1$ and a supply terminal that receives a supply voltage, of a value equal to the high voltage $V_{HV}$, and having the gate terminal connected to the second output terminal $OUT_2$; and a second output transistor 7, which is also of an HV PMOS type, connected between the second output terminal $OUT_2$ and the supply terminal, and having the gate terminal connected to the first output terminal $OUT_1$.

Operation of the level shifter circuit 1 is now described (it should be noted that, for the purposes of its operation, the distinction between the conduction terminals, i.e., the drain and source terminals, of the various NMOS or PMOS transistors is not relevant).

The input signal $V_{in}$, at low voltage, has logic values '0' (low) or '1' (high), being alternatively equal to 0 or to the logic supply voltage Vdd.

The level shifter circuit 1 is configured to supply, on the second output terminal $OUT_2$ the output signal $V_{out}$, shifted upwards with respect to the input signal $V_{in}$, being alternatively equal to 0 or to the high voltage $V_{HV}$. The level shifter circuit 1 further supplies, on the first output terminal $OUT_1$ the negated, or complementary, version of the output signal, $\overline{V_{out}}$, having a high value (equal to the high voltage $V_{HV}$) when the output signal $V_{out}$ has a low value, and a low value when the output signal $V_{out}$ has a high value.

During operation, when the input signal $V_{in}$ is high, the first input transistor 2 and the first protection transistor 4 are both on, whereas the second input transistor 3 and the second protection transistor 5 are both off.

Consequently, the first output terminal $OUT_1$ goes to ground gnd, thus switching-on the second output transistor 7, and the second output terminal $OUT_2$ goes to the high-voltage value $V_{HV}$, thus switching-off the first output transistor 6. Consequently, the output signal $V_{out}$ has a high value $V_{HV}$, shifted to high voltage with respect to the high logic value (Vdd) of the input signal $V_{in}$.

The behaviour of the level shifter circuit 1 is similar, when the input signal $V_{in}$ has a low logic value, supplying at the output a low output signal $V_{out}$ and the complementary signal $\overline{V_{out}}$ with a high value $V_{HV}$.

The desired level-shifting effect is thus obtained, with the input signal $V_{in}$, received on the first input terminal $IN_1$, that switches between gnd and Vdd, and the output signal $V_{out}$, supplied on the second output terminal $Out_2$, shifted upwards, which switches accordingly between gnd and $V_{HV}$.

It should be noted that the first and second protection transistors 4, 5 in the level shifter circuit 1 have the function of protecting the input LV transistors 2, 3 from the high voltage present alternatively on the first output terminal $OUT_1$, or on the second output terminal $OUT_2$.

Figure 2:
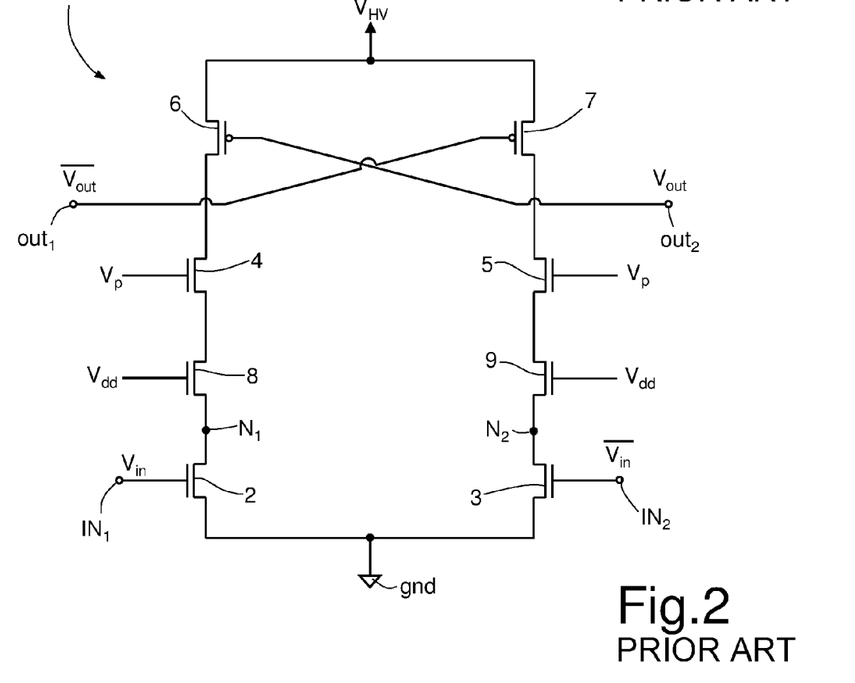
FIG. 2 shows a variant of the level shifter circuit of FIG. 1, which is also of a known type.

As illustrated in FIG. 2, a known further embodiment of level shifter circuit, once again designated by 1, envisages, as compared to the circuit of FIG. 1, the presence of a further pair of protection transistors: a third protection transistor 8, of an LV NMOS type, connected between the first input transistor 2 and the first protection transistor 4, and a fourth protection transistor 9, which is also of an LV NMOS type, connected between the second input transistor 3 and the second protection transistor 5.

In this embodiment, the third and fourth protection transistors 8, 9 receive on their respective gate terminal the logic supply voltage Vdd, whereas the first and second protection transistors 4, 5 receive on their respective gate terminal a protection voltage $V_p$, of an intermediate value between the logic supply voltage Vdd and the high voltage $V_{HV}$, equal, for example, to 1.8 V in the case where the aforesaid logic supply voltage Vdd is equal to 1 V and the aforesaid high voltage $V_{HV}$ is equal to 3.6 V.

In a way that will be evident, general operation of the level shifter circuit 1 does not differ substantially from what has been illustrated previously with reference to FIG. 1, with the advantage of providing a further level of protection for the LV transistors present in the circuit (thus further reducing the risk of corresponding failure).

Although enabling in general the desired level-shifting operation, according to the modalities described previously, the level shifter circuit 1 is not altogether satisfactory.

In particular, the voltage range in which the level shifter circuit 1 operates in a correct and reliable way is limited, in so far as: if it is desired that the high-voltage value $V_{HV}$ increases above a certain value, the circuit may not be reliable, on account of the voltage limits that may be withstood by the MOS transistors used; if, instead, it is desired for the high-voltage value $V_{HV}$ to drop below a given value, the level-switching function may be jeopardized.

Thus, the level shifter circuit 1 does not offer an adequate flexibility as regards the voltage ranges that may be applied.

Furthermore, the circuit configuration described may not be optimized as regards occupation of area in an integrated embodiment.

SUMMARY

The present invention relates to a level shifter circuit, for example, for use in a memory device, and to a corresponding memory device. Embodiments are particularly useful with a non-volatile memory.

Embodiments of the invention solve the problems highlighted previously. Particular embodiments provide an improved solution for a level shifter circuit.

According to one embodiment, a level shifter circuit is designed to shift an input signal that switches within a first voltage range to supply an output signal that switches within a second voltage range, higher than the first voltage range. A first inverter stage has an input receiving the input signal and also has an output. A first capacitive element is connected between the output of the first input inverter stage and a first holding node. A latch stage is connected between the first holding node and a second holding node that is coupled to an output terminal, on which the output signal is present. The first input inverter stage is designed to operate in the first voltage range, and the latch stage is designed to operate in the second voltage range.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF ILLUSTRATIVE EMBODIMENTS

Figure 3:
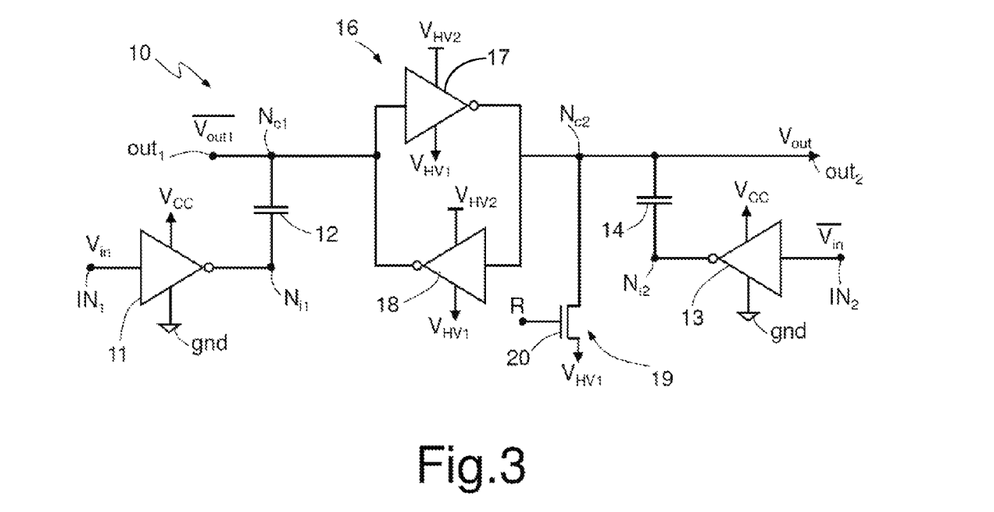
FIG. 3 shows an embodiment of a level shifter circuit according to the present solution.

With initial reference to FIG. 3, an embodiment of a level shifter circuit, here designated by 10, is now described.

The level shifter circuit 10 comprises a first input inverter stage 11, operating at low voltage, i.e., in a range [0, Vcc], where Vcc is a supply voltage at low voltage, with a value equal to or greater than the logic supply voltage Vdd; for example, Vcc may be 1.8 V in the case where the logic supply voltage Vdd is 1 V.

The first input inverter stage 11 is connected to: a first input terminal $IN_1$, which receives a low-voltage input signal, once again designated by $V_{in}$, and is designed to supply at the output the negated version of the above input signal, $\overline{V_{in}}$, on a first internal node $Ni_1$; and a first capacitive element 12, connected between the first internal node $Ni_1$ and a first holding node $Nc_1$.

In the embodiment illustrated, the level shifter circuit 10 further comprises: a second input inverter stage 13, which operates at low voltage, i.e., in the range [0, Vcc], is connected to a second input terminal $IN_2$, receives the negated version of the input signal $\overline{V_{in}}$, and is designed to supply at the output the same input signal Vin on a second internal node $Ni_2$; and a second capacitive element 14, which is connected between the second internal node $Ni_2$ and a second holding node $Nc_2$.

The level shifter circuit 10 further comprises a latch (or holding) stage 16, which has an input connected to the first holding node $Nc_1$ and an output connected to the second holding node $Nc_2$, and operates in a high-voltage range $[V_{HV1}, V_{HV2}]$, where $V_{HV1}$ is a lower-limit voltage of the range (of a value greater than or equal to the supply voltage Vcc) and $V_{HV2}$ is an upper-limit voltage of the range (of a value greater than the aforesaid lower-limit voltage). In other words, the values $V_{HV1}$ and $V_{HV2}$ represent the two biasing reference values of the latch stage 16.

The same latch stage 16 is configured to hold the high-voltage logic values on the aforesaid first and second holding nodes $Nc_1$, $Nc_2$, these values being alternatively equal to the lower-limit voltage $V_{HV1}$ or to the upper-limit voltage $V_{HV2}$, and may be switched following upon an external stimulus received on the first input terminal $IN_1$, i.e., following upon switching of the input signal $V_{in}$ (as will be discussed in detail in what follows).

The first and second output terminals $OUT_1$, $OUT_2$ of the level shifter circuit 10 are coupled, respectively, to the first and second holding nodes $Nc_1$, $Nc_2$, and supply in this case the negated, or complementary, version of the output signal, $\overline{V_{out}}$, and, respectively, the same output signal $V_{out}$.

In the embodiment illustrated, the latch stage 16 comprises: a first latch inverter 17, having its input connected to the first holding node $Nc_1$ and its output connected to the second holding node $Nc_2$; and a second latch inverter 18, having a respective input connected to the output of the first latch inverter 17, and thus to the second holding node $Nc_2$, and a respective output connected to the input of the first latch inverter 17, and thus to the first holding node $Nc_1$.

The first and second latch inverters 17 both have a first biasing input and a second biasing input, which receive, respectively, the lower-limit voltage $V_{HV1}$ and the upper-limit voltage $V_{HV2}$.

The level shifter circuit lo further comprises an initialization stage 19, which is connected, in the embodiment illustrated, to the second holding node $Nc_2$ and comprises an initialization transistor 20, in the example an NMOS transistor connected between the second holding node $Nc_2$ and a reference terminal set at the lower-limit voltage $V_{HV1}$ (which thus represents an initialization voltage for the initialization stage 19) and having its gate terminal that receives a reset signal R. The reset signal R is generated (in a way not described in detail herein) externally to the level shifter circuit 10, for example, by a control unit of an electronic device (not illustrated herein) in which the level shifter circuit 10 is used.

Operation of the level shifter circuit 10 is now described.

It is assumed first that the input signal $V_{in}$ has a high value (Vcc): in this situation, the value of the output signal $V_{out}$, which is also high, is shifted into the high-voltage range, i.e., equal to the upper-limit voltage $V_{HV2}$, whereas the complementary signal of the same output signal, $\overline{V_{out}}$, is equal to the lower-limit voltage $V_{HV1}$.

It is now assumed that the input signal $V_{in}$ switches from the high value (Vcc) to the low value (0). The output of the first input inverter stage 11 consequently switches to the high value, and the consequent voltage increase is transferred from the first capacitive storage element 12 to the first holding node $Nc_1$, on which an incremental voltage step occurs.

This voltage increase causes switching of the latch stage 16, so that the output signal $V_{out}$ switches to the low value, equal to the lower-limit voltage $V_{HV1}$, and the complementary signal $\overline{V_{out}}$ goes to the high value, i.e., to the upper-limit voltage $V_{HV2}$.

The above values for the output signal $V_{out}$ and for the complementary signal $\overline{V_{out}}$ are held until a new switching of the input signal $V_{in}$ occurs.

It should be noted that the presence of the second input inverter stage 13 and of the second coupled capacitive storage element 14 contributes to ensuring proper operation of the level shifter circuit 10 and proper switching of the latch stage 16, transferring onto the second holding node $Nc_2$ the complementary voltage variation due to switching of the negated version of the input signal, $\overline{V_{in}}$.

Furthermore, the initialization stage 19 enables initialization of the state of the level shifter circuit 10, in an initial operating condition (for example, upon switching-on of the electronic device in which the level shifter circuit 10 is used, or else upon return from a so-called "stand-by" condition).

In particular, the reset signal R, sent, for example, to a high value, causes closing of the initialization transistor 20, forcing the value of the voltage on the second holding node $Nc_2$ to the initialization voltage, in this case to the low value, i.e., to the lower-limit voltage $V_{HV1}$, thus forcing the initial state of the latch stage 16 (the value of the voltage on the first holding node $Nc_1$ consequently goes the high value, i.e., to the upper-limit voltage $V_{HV2}$).

In other words, the initialization stage 19 enables establishment of a pre-set and pre-defined initial state for the level shifter circuit 10, which persists until the input signal $V_{in}$ assumes a suitable value, such as to cause switching of the latch stage 16.

According to a particular aspect of the present solution, the values of the lower-limit voltage $V_{HV1}$ and of the upper-limit voltage $V_{HV2}$ may advantageously be modified and shifted in an appropriate way, for obtaining different, high and low, values for the output signal $V_{out}$, simply by modifying the biasing reference values of the latch stage 16, without on the other hand modifying operation of the level shifter circuit 10.

For instance, the value of the lower-limit voltage $V_{HV1}$ may be shifted from 1.6 V to 2 V, and the value of the upper-limit voltage $V_{HV2}$ may be shifted from 3.6 V to 4 V. It should be noted that, as in this example, the values of the lower-limit voltage $V_{HV1}$ and of the upper-limit voltage $V_{HV2}$ may be shifted by the same amount. However, there may be envisaged also a different shift for these values, provided that the value of this shift is compatible with the circuit components used in the latch stage 16.

Figure 4:
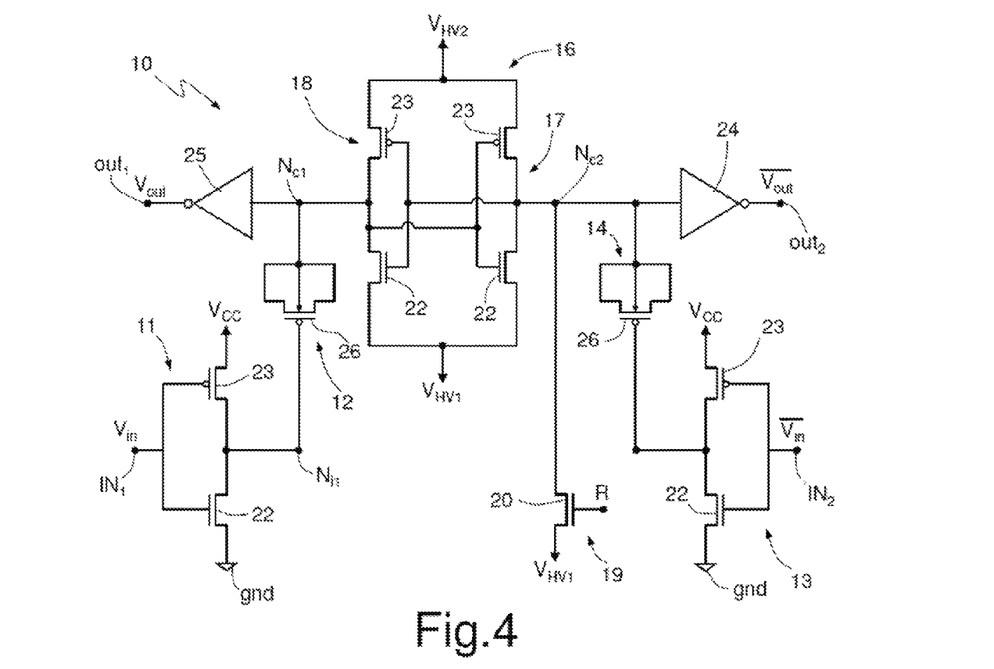
FIG. 4 shows in greater detail the level shifter circuit of FIG. 3, in a possible circuit implementation.

A possible implementation of the level shifter circuit 10 is now described in greater detail, with reference to FIG. 4.

In this implementation, the first input inverter stage 11, the second input inverter stage 13, the first latch inverter 17, and the second latch inverter 18 are each implemented by a respective pair of MOS transistors (in a possible embodiment, LV transistors in the case of the first and of the second input inverter stages 11, 13, and HV transistors in the case of the first and second latch inverters 17, 18), in particular by a respective NMOS inverter transistor 22 and by a respective PMOS inverter transistor 23.

The NMOS inverter transistor 22 and the PMOS inverter transistor 23 have: gate terminals connected together and to a same circuit node (in particular, the first and second input terminals $IN_1$, $IN_2$ in the case of the first, and respectively, the second input inverter stages 11, 13, and the first and second holding nodes $Nc_1$, $Nc_2$ in the case of the first and second latch inverters 17, 18); first current-conduction terminals connected together and to a same circuit node (in particular, the first and second internal nodes $Ni_1$, $Ni_2$ in the case of the first and, respectively, the second input inverter stages 11, 13, and the second and first holding nodes $Nc_2$, $Nc_1$ in the case of the first and second latch inverters 17, 18); and second current-conduction terminals receiving a respective reference biasing voltage (in particular, the ground reference voltage gnd and the supply voltage Vcc for the first and second input inverter stages 11, 13, and the reference biasing values $V_{HV1}$ and $V_{HV2}$ for the first and second latch inverters 17, 18).

According to a further aspect of the present solution, illustrated in the same FIG. 4, both the first and the second capacitive elements 12, 14 may also be implemented by a respective PMOS transistor 26, having: current-conduction terminals connected together and to the respective bulk terminal, and further to a respective first circuit node (the first holding node $Nc_1$ for the first capacitive element 12, and the second holding node $Nc_2$ for the second capacitive element 14); and gate terminal connected to a respective second circuit node (the first internal node $Ni_1$ for the first capacitive element 12, and the second internal node $Ni_2$ for the second capacitive element 14).

This implementation is thus, advantageously, totally integrated (in other words, it does not require the presence of discrete circuit components).

In the embodiment shown in FIG. 4 (in a way, however, optional for operation of the level shifter circuit 10) a first output buffer 24 and a second output buffer 25, of an inverting type, are moreover present, connected, respectively, between the first holding node $Nc_1$ and the second output terminal $Out_2$ (on which, consequently, the output voltage $V_{out}$ is in this case present), and between the second holding node $Nc_2$ and the first output terminal $Out_1$ (on which the negated version of the output voltage, $\overline{V_{out}}$, is consequently present).

As mentioned previously, the level shifter circuit 10 may find advantageous application in an integrated non-volatile memory device.

Figure 5:
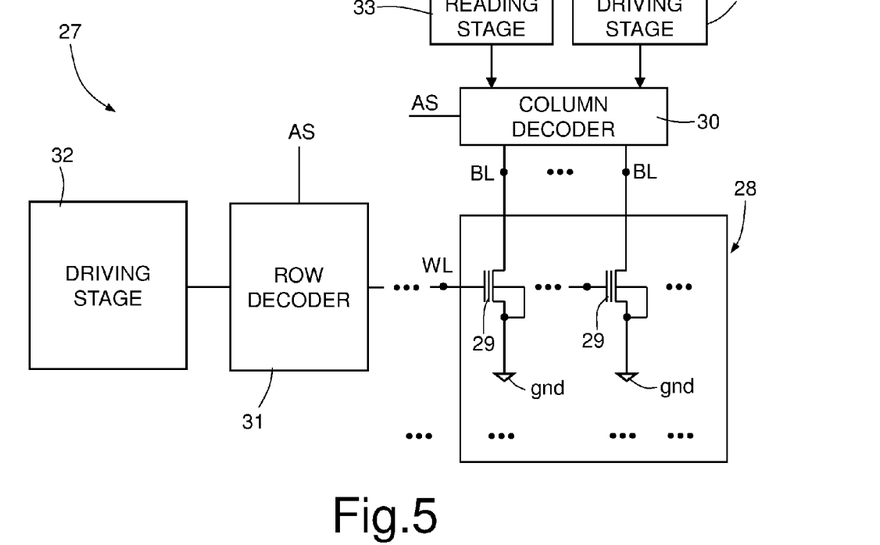
FIG. 5 shows a block diagram of a memory device that uses the level shifter circuit of FIG. 3, in a corresponding address-decoder stage.

As illustrated schematically in FIG. 5, a non-volatile memory device, designated by 27, comprises in general a memory array 28 constituted by a plurality of memory cells 29, arranged in wordlines WL and bitlines BL.

Each memory cell 29 is constituted by a storage element, including a floating-gate transistor in the case of flash memories or a phase-change material element (for example, a chalcogenide, such as GST) in the case of PCM memories, appropriately connected to a respective bitline BL and to a respective wordline WL.

A column decoder 30 and a row decoder 31 enable selection of the memory cells 29 on the basis of address signals received at the input (generated in a known way and designated as a whole by AS) and appropriate decoding schemes, and in particular selection of the corresponding bitlines BL and of the corresponding wordlines WL, each time addressed, enabling their biasing at desired voltage and current values during the reading and programming operations, by means of appropriate driving stages 32.

Moreover, a reading stage 33 is selectively coupled to the memory array 28 via the column decoder 30, during the operations of reading of the contents of the memory cells 29.

The level shifter circuit 10 according to the present solution may, for example, be used within the column and row decoders 30, 31 to enable generation of the appropriate quantities, for selection and biasing of the bitlines BL and wordlines WL.

Figure 6:
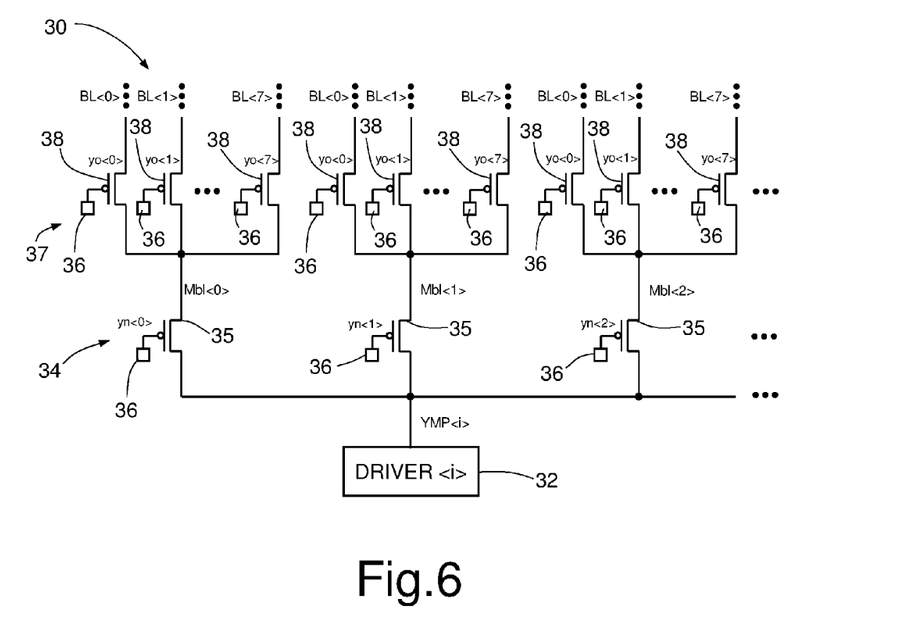
FIG. 6 shows a more detailed block diagram of the address-decoder stage in the memory device of FIG. 5.

In particular, as shown in greater detail in FIG. 6, the column decoder 30 may have, in a per se known manner, a hierarchical decoding structure, with a number of decoding stages.

A first decoding stage 34 includes a plurality of global-selection transistors 35, in the example of a PMOS type, which enable selection and biasing of a respective plurality of global bitlines (or main bitlines) MBL<0>, MBL<1>, MBL<2>, etc., one for each sector of the memory array 28.

Each global-selection transistor 35 receives on a control terminal thereof a respective global-selection signal yn<0>, yn<1>, yn<2>, etc., having a first value, for example a high value, for connecting the respective global bitline MBL to a respective module (driver) of the driving stage 32 of the non-volatile memory device 27, which supplies a driving signal YMP<i>, and a second value, in the example low, for disconnecting the same global bitline MBL from the driving stage 32.

Each global-selection signal yn is generated by a respective level shifter module 36, comprising, as described in detail hereinafter, the level shifter circuit 10.

A second decoding stage 37 includes a plurality of local-selection transistors 38, in the example of a PMOS type, for each sector of the memory array 28, each connected between a respective global bitline MBL and a respective memory cell 29 belonging to the sector (not illustrated herein).

Each local-selection transistor 38 receives on a control terminal thereof a respective local-selection signal yo<0>, yo<1>, yo<2>, etc. (for example, eight in number), which has a first value, for example high, for connecting the global bitline MBL associated to the respective sector to a respective bitline BL<0>, BL<1>, BL<2>, etc., of the same sector (and to the associated memory cell 29), and a second value, in the example low, for disconnecting the same global bitline MBL from the respective bitline BL.

Each local-selection signal yo is generated by a respective level shifter module 36, comprising a level shifter circuit 10.

For instance, the first value of the global-selection signal yn and of the local-selection signal yo may be equal to 3.6 V and the second value may be equal to 1.8 V.

Figure 7A:
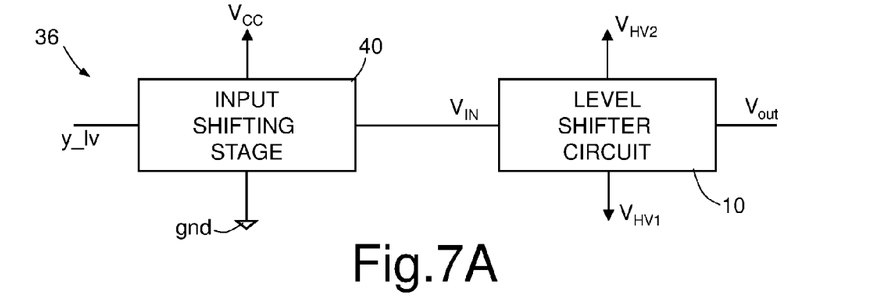
FIGS. 7A and 7B show a more detailed block diagram of a level shifter module in the address-decoder stage of FIG. 6.
Figure 7B:
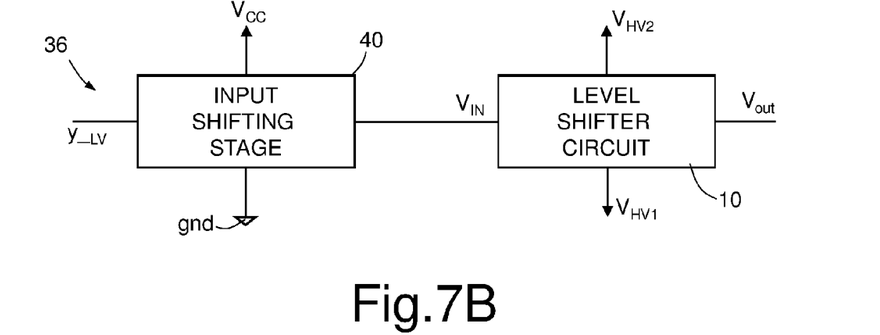

As shown in FIG. 7A and 7B, in a possible embodiment, each level shifter module 36 may comprise an input shifter stage 40, configured to carry out a first level shifting of a low-voltage selection signal y_lv, supplied by a control unit of the non-volatile memory device 27, here not illustrated. The selection signal y_lv has, for example, a value that switches between o V and 1 V (i.e., between ground gnd and the logic supply voltage Vdd).

In particular, the input stage 40 operates in the range [0, $V_{cc}$] and supplies at output the input signal $V_{in}$ for the level shifter circuit 10, with a value equal to $V_{cc}$ (for example, 1.8 V) or to 0 V, according to whether the selection signal y_lv is high (1 V) or, respectively, low (0 V).

The level shifter circuit 10 operates, as discussed previously in the range [$V_{HV1}$, $V_{HV2}$], with $V_{HV1}$ in this example equal to 1.8 V and $V_{HV2}$ equal to 3.6 V, supplying at the output, as output signal $V_{out}$, the respective global-selection signal yn or the respective local-selection signal yo, according to the decoding level, with a value equal to $V_{HV2}$, or to $V_{HV1}$, according to whether the input signal $V_{in}$ is high or, respectively, low.

In this embodiment, the aforesaid control unit of the non-volatile memory device 27 may further supply the reset signal R for the level shifter circuits 10.

The advantages of the solution proposed are clear from the foregoing description.

In particular, this solution provides a level shifter circuit 10 having a high flexibility, in particular as regards an operating voltage range, at the same time maintaining a compact circuit structure (using a limited number of transistors) that requires a reduced occupation of area in an integrated embodiment.

This solution is particularly advantageous in particularly scaled technologies (for example, the 28-nm FD-SOI technology), and, in general, for applications in non-volatile memory devices, for example in corresponding column and/or row decoders.

As discussed previously, particularly advantageous is the possibility of shifting the values of the operating voltage range and, consequently, the values assumed by the output signal, according to the operating requirements, for example for providing the various biasing values required for the operations of reading and programming in a memory device.

Finally, it is clear that modifications and variations may be made to what has been described and illustrated herein, without thereby departing from the scope of the present invention, as defined in the annexed claims.

Figure 8:
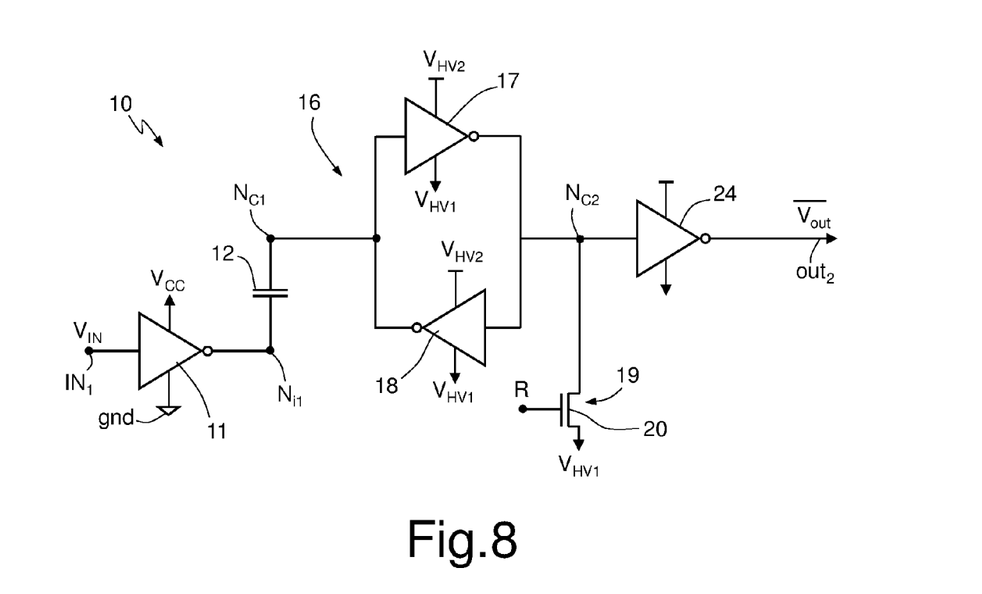
FIG. 8 shows a further embodiment of a level shifter circuit according to the present solution.

In particular, as illustrated in FIG. 8, a possible variant of the level shifter circuit, once again designated by 10, may envisage the absence of the second input inverter stage 13 and of the associated second capacitive element 14. Thus, in this solution, driving of the latch stage 16 occurs only at one side of the level shifter circuit 1.

In the embodiment illustrated, an output buffer stage 24 is once again present, also in this case of an inverting type, which supplies the negated version of the output signal $\overline{V_{out}}$.

This solution may be advantageous, in so far as it enables further reduction of the occupation of area and circuit complexity, at the expense, however, of a possible lower reliability of the level-shifting operations.

Furthermore, even though the foregoing description has made specific reference to the use of the level shifter circuit 10 in the column decoder 30 of the non-volatile memory device 27, it is evident that the same level shifter circuit 10 may likewise be used in the row decoder 31 of the non-volatile memory device 27. The row decoder 31 comprises, in fact, in a known way, further selection transistors controlled by respective control signals, which may be generated by respective level shifter modules, and each of the level shifter modules may include a respective level shifter circuit.

Finally, it is emphasized that, as it has already been highlighted above, even though particular reference has been made to a use within non-volatile memory devices, the solution described may be advantageously employed in any application in which level shifting of an input signal into an output signal is required, with high operating flexibility and low circuit complexity.

What is claimed is:

1. A level shifter circuit comprising:
   a first input inverter stage having an input configured to receive an input signal that switches within a first voltage range, wherein the first input inverter stage is designed to operate in the first voltage range;
   a first capacitive element coupled between an output of the first input inverter stage and a first holding node;
   a latch stage coupled between the first holding node and a second holding node, the second holding node serving as an output terminal configured to supply an output signal that switches within a second voltage range that is higher than the first voltage range, wherein the latch stage is designed to operate in the second voltage range; and
   an initialization stage coupled to the second holding node and configured to define an initial operating state of the latch stage, wherein the initialization stage comprises an initialization transistor having a current path coupled between the second holding node and a reference terminal set at an initialization voltage, and having a gate configured to receive a reset signal.

2. The circuit according to claim 1, wherein the second voltage range has a lower-limit voltage and an upper-limit voltage;
   wherein the latch stage has biasing reference inputs configured to receive the lower-limit voltage and the upper-limit voltage;
   wherein the latch stage is configured to hold voltage values on the first holding node and the second holding node, alternatively equal to the lower-limit voltage or to the upper-limit voltage; and
   wherein the latch stage is configured to switch its operating state following upon switching of the input signal.

3. The circuit according to claim 1, wherein the latch stage comprises:
   a first latch inverter having an input coupled to the first holding node and an output coupled to the second holding node; and
   a second latch inverter having an input coupled to the output of the first latch inverter and an output coupled to the input of the first latch inverter, wherein the first and second latch inverters are configured to operate in the second voltage range.

4. The circuit according to claim 1, wherein the latch stage comprises:
   a first PMOS transistor having a gate coupled to the second holding node and a current path coupled between a high voltage node and the first holding node, the high voltage node configured to carry a voltage at an upper end of the second voltage range;
   a first NMOS transistor having a gate coupled to the second holding node and a current path coupled between the first holding node and a low voltage node, the low voltage node configured to carry a voltage at a lower end of the second voltage range;
   a second PMOS transistor having a gate coupled to the first holding node and a current path coupled between the high voltage node in the second holding node; and
   a second NMOS transistor having a gate coupled to the first holding node and a current path coupled between the second holding node and the low voltage node.

5. The circuit according to claim 1, wherein the initialization stage is configured to control initialization of the second holding node at an initialization voltage to define an initial operating state of the latch stage.

6. The circuit according to claim 1, further comprising:
   a second input inverter stage having an input configured to receive a complementary input signal that switches with the first voltage range, the complementary input signal being a complement of the input signal; and
   a second capacitive element coupled between an output of the second input inverter stage and the second holding node.

7. The circuit according to claim 1, wherein the first capacitive element comprises a MOS transistor having current-conduction terminals connected together, to a respective bulk terminal, and further to the first holding node, the MOS transistor also having a gate terminal coupled to the output of the first input inverter stage.

8. The circuit according to claim 1, further comprising:
   a first output buffer having an input coupled to the first holding node; and
   a second output buffer having an input coupled to the second holding node, an output of the second output buffer being the complement of an output of the first output buffer.

9. The circuit according to claim 1, wherein the input signal is configured to switch between a lower value and an upper value of the first voltage range, and the output signal is configured to switch, between an upper-limit voltage and a lower-limit voltage of the second voltage range.

10. A level shifter circuit comprising:
    a first input inverter stage having an input configured to receive an input signal that switches within a first voltage range and an output coupled to a first holding node, wherein the first input inverter stage is configured to operate in the first voltage range;
    a latch stage coupled between the first holding node and a second holding node, the second holding node serving as an output terminal configured to supply an output signal that switches within a second voltage range that is higher than the first voltage range, wherein the latch stage is configured to operate in the second voltage range;

a second input inverter stage having an input configured to receive a complementary input signal that switches with the first voltage range, the complementary input signal being a complement of the input signal, the second input inverter stage also having an output coupled to the second holding node, wherein the second input inverter stage is configured to operate in the first voltage range; and an initialization stage coupled to the second holding node and configured to define an initial operating state of the latch stage, wherein the initialization stage comprises an initialization transistor having a current path coupled between the second holding node and a reference terminal set at an initialization voltage, and having a gate configured to receive a reset signal.

11. The circuit according to claim 10, further comprising:
a first capacitive element coupled between the output of the first input inverter stage and the first holding node; and
a second capacitive element coupled between the output of the second input inverter stage and the second holding node.

12. A memory device, comprising:
a memory array including a plurality of memory cells arranged in rows and columns, the memory cells being coupled to respective wordlines and bitlines;
a decoder stage, configured to select and bias the wordlines or the bitlines as a function of address signals, wherein address signals comprise signals that switch within a first voltage range and the wordlines or bitlines are biased at a voltage within a second voltage range that is greater than first voltage range, wherein the decoder stage comprises a plurality of shifter circuits, each level shifter circuit comprising:
a first input inverter stage having an input configured to receive an address signal, wherein the first input inverter stage is configured to operate in the first voltage range;
a first capacitive element coupled between an output of the first input inverter stage and a first holding node;
a latch stage coupled between the first holding node and a second holding node, the second holding node serving as a terminal configured to supply a bias signal for use with a respective wordline or bitline, wherein the latch stage is configured to operate in the second voltage range; and
an initialization stage coupled to the second holding node and configured to define an initial operating state of the latch stage, wherein the initialization stage comprises an initialization transistor having a current path coupled between the second holding node and a reference terminal set at an initialization voltage, and having a gate configured to receive a reset signal.

13. The device according to claim 12, wherein the decoder stage comprises a plurality of selection transistors, which are operable for selectively coupling the wordlines or the bitlines to a driving stage, and wherein each shifter circuit is configured to generate the bias signal the selection transistor associated with the respective wordline or bitline.

14. The device according to claim 12, wherein each level shifter circuit further comprises an input shifter stage, configured to carry out a first level shifting of a selection signal, switching in a third voltage range that is lower than the first voltage range, the input shifter stage having an output coupled to the input of the first input inverter stage.

15. The device according to claim 12, wherein the initialization stage is configured to control initialization of the second holding node at an initialization voltage to define an initial operating state of the latch stage.

16. The device according to claim 12, further comprising an output buffer having an input coupled to the second holding node and an output configured to supply the bias signal.

17. The memory device according to claim 12, wherein each memory cell comprises a non-volatile memory cell.

18. The memory device according to claim 17, wherein each memory cell comprises a flash memory cell.

19. The memory cell according to claim 17, wherein each memory cell comprises a phase change memory (PCM) cell.

20. A method of operating a level shifter circuit, the method comprising:
receiving an input signal that switches within a first voltage range with a first input inverter having an output coupled to a first holding node;
latching a value of the input signal into a latch circuit coupled between the first holding node and a second holding node by using a first capacitive element coupled between the first input inverter and the first holding node, wherein the latch circuit comprises a first supply terminal and a second supply terminal;
supplying an output signal with the second holding node, wherein the second holding node switches within a second voltage range different than the first voltage range; and
initializing a state of the latch circuit by providing a reset signal to a control terminal of an initialization transistor having a current path coupled between the first supply terminal and the second holding node.

21. The method of claim 20, further comprising:
receiving a complementary input signal that switches within the first voltage range with a second input inverter having an output coupled to the second holding node, the second input inverter further comprising an output coupled to the second holding node via a second capacitive element.

22. The method of claim 21, wherein, the first input inverter comprises a third supply terminal and a fourth supply terminal, the method further comprising:
providing a first voltage to the first supply terminal;
providing a second voltage to the second supply terminal;
providing a third voltage to the third supply terminal; and
providing a fourth voltage to the fourth supply terminal, wherein the first, second, third and fourth voltages are different to each other, wherein the second voltage is higher than the first voltage, wherein the fourth voltage is higher than the third voltage, and wherein the second voltage is higher than the fourth voltage.

23. The method of claim 22, wherein:
the first voltage is higher or equal to 1.6 V;
the second voltage is higher or equal to 3.6 V;
the third voltage is equal to 0 V; and
the fourth voltage is equal to 1.8 V.

* * * * *